(12) United States Patent
Lin et al.

(10) Patent No.: US 12,080,688 B2
(45) Date of Patent: Sep. 3, 2024

(54) LIGHT-EMITTING DIODE PACKAGING MODULE

(71) Applicant: QUANZHOU SANAN SEMICONDUCTOR TECHNOLOGY CO., LTD., Quanzhou (CN)

(72) Inventors: Zhen-Duan Lin, Xiamen (CN); Yanqiu Liao, Xiamen (CN); Shuning Xin, Xiamen (CN); Weng-Tack Wong, Xiamen (CN); Junpeng Shi, Xiamen (CN); Aihua Cao, Xiamen (CN); Changchin Yu, Xiamen (CN); Chi-Wei Liao, Xiamen (CN); Chen-ke Hsu, Xiamen (CN); Zheng Wu, Xiamen (CN); Chia-en Lee, Xiamen (CN)

(73) Assignee: Quanzhou Sanan Semiconductor Technoogy Co., Ltd., Fujian (CN)

( * ) Notice: Subject to any disclaimer, the term of this patent is extended or adjusted under 35 U.S.C. 154(b) by 417 days.

(21) Appl. No.: 17/578,817

(22) Filed: Jan. 19, 2022

(65) Prior Publication Data
US 2022/0139890 A1 May 5, 2022

Related U.S. Application Data

(63) Continuation-in-part of application No. PCT/CN2020/098501, filed on Jun. 28, 2020.

(30) Foreign Application Priority Data

Jul. 26, 2019 (CN) .......................... 201921192783.2
Sep. 18, 2019 (CN) .......................... 201921553490.2

(51) Int. Cl.
*H01L 25/075* (2006.01)
*H01L 33/38* (2010.01)
(Continued)

(52) U.S. Cl.
CPC .......... *H01L 25/0753* (2013.01); *H01L 33/38* (2013.01); *H01L 33/54* (2013.01); *H01L 33/62* (2013.01)

(58) Field of Classification Search
CPC ..... H01L 25/0753; H01L 33/38; H01L 33/54; H01L 33/62; H01L 33/483
See application file for complete search history.

(56) References Cited

U.S. PATENT DOCUMENTS

2019/0081025 A1\* 3/2019 Chang .................... H01L 33/007
2019/0326477 A1\* 10/2019 Kim ........................ H01L 33/20
2023/0290916 A1\* 9/2023 Um ...................... H01L 25/0753

FOREIGN PATENT DOCUMENTS

CN        101083193 A      12/2007
CN        109952641 A       6/2019

OTHER PUBLICATIONS

Search Report issued to PCT application No. PCT/CN2020/098501 on Sep. 28, 2020.

\* cited by examiner

*Primary Examiner* — Douglas W Owens
(74) *Attorney, Agent, or Firm* — Thomas | Horstemeyer, LLP

(57) ABSTRACT

A light-emitting diode (LED) packaging module includes LED chips, a wiring layer, and an encapsulant component. Each of the LED chips includes a chip first surface, a chip second surface, a chip side surface, and an electrode unit. The wiring layer is disposed on the chip second surfaces of the LED chips, and contacts and is electrically connected to the electrode units. The encapsulant component includes a first encapsulating layer that covers the chip side surface, and a second encapsulating layer that covers the wiring layer. The LED chip has a thickness $T_A$, the first encapsulating layer has a thickness $T_B$, in which $T_B/T_A \geq 1$.

20 Claims, 9 Drawing Sheets

(51) Int. Cl.
*H01L 33/54* (2010.01)
*H01L 33/62* (2010.01)

LIGHT-EMITTING DIODE PACKAGING MODULE

CROSS-REFERENCE TO RELATED APPLICATION

This application is a bypass continuation-in-part (CIP) application of PCT International Application No. PCT/CN2020/098501, filed on Jun. 28, 2020, which claims priority of Chinese Utility Model Patent Application No. 201921192783.2, filed on Jul. 26, 2019, and Chinese Utility Model Patent Application No. 201921553490.2, filed on Sep. 18, 2019. The entire content of the international patent application is incorporated herein by reference.

FIELD

The disclosure relates to a light-emitting diode (LED) packaging module and a display device including the same.

BACKGROUND

Light-emitting diodes (LEDs) are one of the most popular light source technologies nowadays, which may be used as light sources of lighting devices, and may also be used as light sources of various electronic products. For example, the LEDs are widely used as light sources of various display apparatuses such as TVs, cellular phones, PCs, notebook PCs and personal digital assistants (PDAs). Display resolution may be improved by reducing a size of an LED device, so as to expand application fields of LED display screens, such as mobile phones, vehicle-mounted panels, televisions, computers and video conferencing.

In the market of display screens, small-sized RGB LEDs have grown rapidly and occupy more and more market shares. The small-sized RGB LEDs bring an extremely high pixel experience to the display screens. However, at the same time, the small-sized RGB LEDs also bring great challenges in terms of manufacturing processes. That is, due to their greater thicknesses, thicknesses and application fields of application products are limited. In the related art, RGB chips are fixed mainly to a substrate. Face-up chips require wire bonding or inversion of solder paste, flip chips require solder paste, and vertical chips also require wire bonding. In this way, a packaging thickness is determined by the substrate, the solder paste or wire bonding and thicknesses of the chips, so that the packaging thickness may generally be greater than 500 μm, which is not conducive to thinness and integration of packaging devices. At the same time, due to miniaturization of size, selection of materials such as solder paste on a packaging end, efficiency and yield of die bonding precision are closely related to costs. Each link faces technical difficulties. Further, the display screens have high requirements on picture quality and a display effect, while treatment processes of packaging surfaces vary, and light color differences exist between pixels, which is easy to lead to light mixing inconsistency and high difficulty of correction, thereby affecting a high-quality display effect.

SUMMARY

Therefore, an object of the disclosure is to provide a light-emitting diode (LED) packaging module and a display device including the same that can alleviate at least one of the drawbacks of the prior art.

According to a first aspect of the present disclosure, the LED packaging module includes a plurality of LED chips that are spaced apart from each other, a wiring layer, and an encapsulant component. Each of the LED chips includes a chip first surface as a light-exiting surface, a chip second surface opposite to the chip first surface, a chip side surface that connects the chip first surface and the chip second surface, and an electrode unit formed on the chip second surface. The wiring layer is disposed on the chip second surfaces of the LED chips, and has a first wiring layer surface adjacent to the LED chips, a second wiring layer surface opposite to the first wiring layer surface, and a side wiring layer surface that is connected to the first wiring layer surface and the second wiring layer surface. The wiring layer is divided into a plurality of wiring parts that are spaced apart from each other. The first wiring layer surface contacts and is electrically connected to the electrode units of the LED chips. The encapsulant component includes a first encapsulating layer that covers the chip side surface of each of the LED chips, and a second encapsulating layer that covers the side wiring layer surface of the wiring layer and that fills gaps among the wiring parts. Each of the LED chips has a thickness $T_A$, the first encapsulating layer has a thickness $T_B$, and $T_A$ and $T_B$ satisfy a relationship: $T_B/T_A \geq 1$.

According to a second aspect of the present disclosure, the LED packaging module includes a plurality of LED chips that are spaced apart from each other, a wiring layer, an encapsulant component, and a light-transmitting layer. Each of the LED chips includes a chip first surface as a light-exiting surface, a chip second surface opposite to the chip first surface, at least two electrodes disposed on the chip second surface, and a chip side surface connected to the chip first surface and the chip second surface. The wiring layer is disposed on the chip second surfaces of the LED chips, and has a first wiring layer surface, a second wiring layer surface opposite to the first wiring layer surface, and a side wiring layer surface connected to the first wiring layer surface and the second wiring layer surface. The wiring layer is divided into a plurality of wiring parts that are spaced apart from each other. The first wiring layer surface contacts and is electrically connected to the electrodes of the LED chips. The encapsulant component covers the LED chips and the wiring layer, and fills gaps among the LED chips and gaps among the wiring parts. The encapsulant component includes a first encapsulating surface, and a second encapsulating surface opposite to the first encapsulating surface. The light-transmitting layer covers the chip first surfaces of the LED chips. The first encapsulating surface of the encapsulant component faces in a same direction as the chip first surfaces of the LED chips. The second encapsulating surface of the encapsulant component faces in a same direction as the second wiring layer surface of the wiring layer. The chip first surfaces of at least two of the LED chips have a height difference that is greater than 0 μm and not greater than 15 μm. The at least two of the LED chips have different wavelengths.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
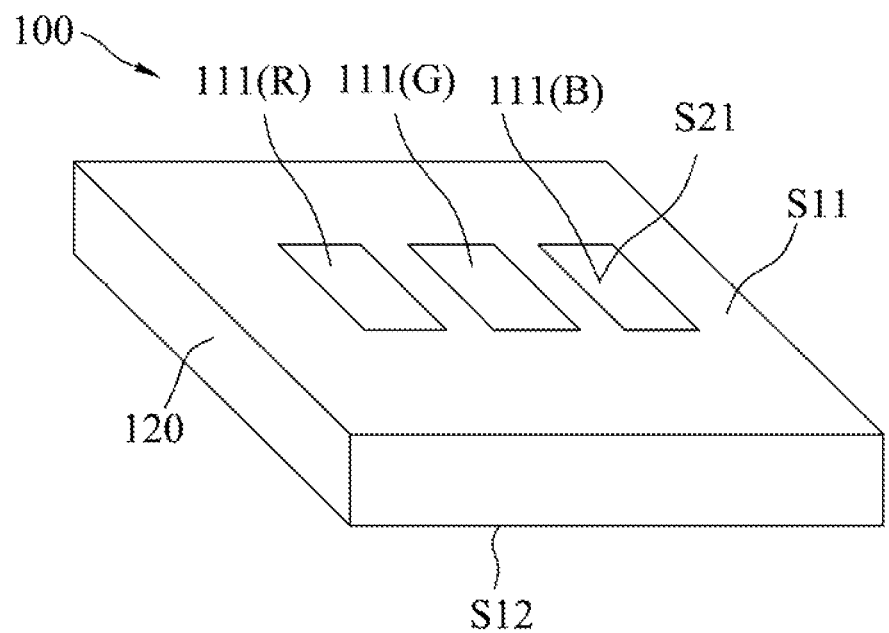
FIG. 1 is a perspective view of a first embodiment of a light-emitting diode (LED) packaging module according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
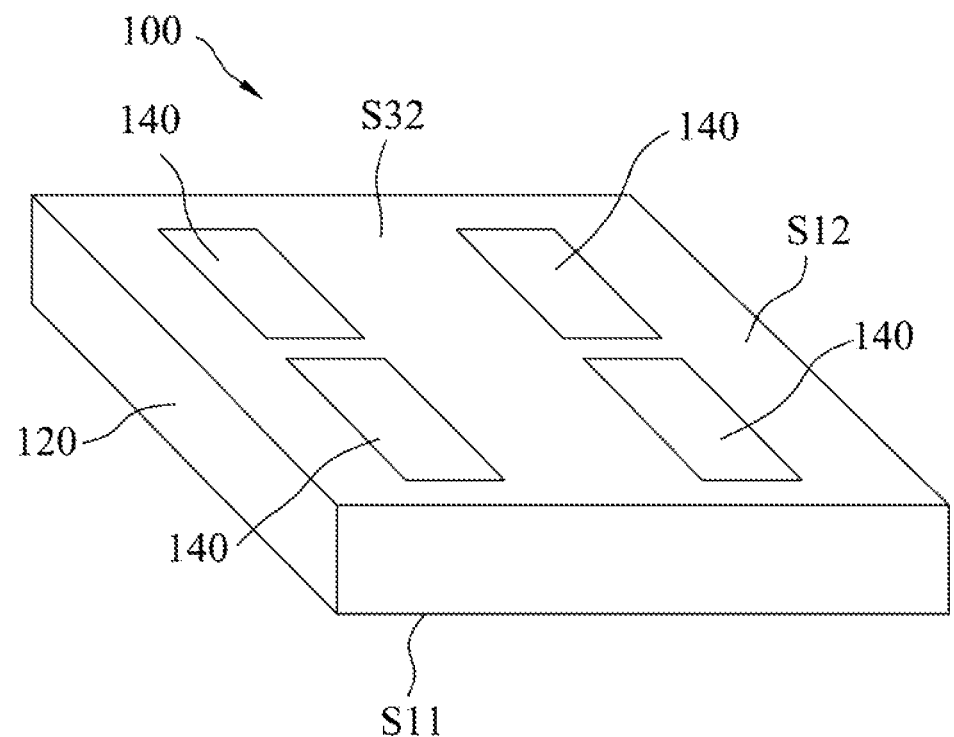
FIG. 2 is another perspective view of the first embodiment of the LED packaging module.

Referring to FIGS. 1 to 3, a first embodiment of a light-emitting diode (LED) packaging module 100 according to the present disclosure is provided. The LED packaging module 100 includes a plurality of LED chips 111 spaced apart from each other, a wiring layer 130, and an encapsulant component 120. In some embodiments, the LED packaging module 100 further includes at least two welding pads 140.

Figure 4:
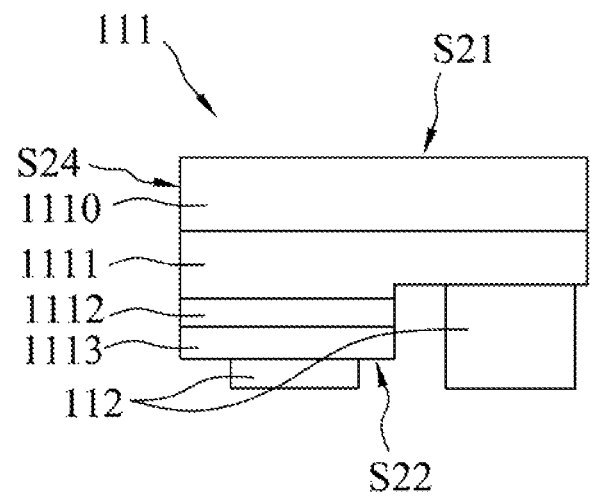
FIG. 4 is a schematic view of a LED chip used in some embodiments of the LED packaging module according to the present disclosure.

Referring to FIG. 4, each of the LED chips 111 may have a flip-chip structure. Each of the LED chips 111 includes a chip first surface S21 as a light-exiting surface, a chip second surface S22 opposite to the chip first surface S21, a chip side surface S24 that connects the chip first surface S21 and the chip second surface S22, and an electrode unit 112 disposed on the chip second surface S22. In some embodiments, the first chip surface S21 of each of the LED chips 111 may be a transparent roughened surface (not shown) such that diffuse reflection can be achieved, thereby reducing glare. The transparent roughened surface may be made of a matte material.

In some embodiments, each of the LED chips 111 further includes a transparent substrate 1110 that has one surface serving as the chip first surface S21 (i.e., the light-exiting surface). In some embodiments, each of the LED chips 111 further includes a semiconductor stack that is formed on another surface of the transparent substrate 1110 opposite to the one surface serving as the chip first surface S21, and that includes a first semiconductor layer 1111, an active layer 1112, and a second semiconductor layer 1113. The first semiconductor layer 1111 has a conductivity type different from that of the second semiconductor layer 1113. In some embodiments, a patterned layer or a bonding layer may be disposed between the transparent substrate 1110 and the semiconductor stack. In some embodiments, the first semiconductor layer 1111 may be a p-type semiconductor layer, and the second semiconductor layer 1112 may be an n-type layer. In some other embodiments, the first semiconductor layer 1111 may be an n-type semiconductor layer, and the second semiconductor layer 1112 may be a p-type layer.

Referring back to FIG. 3A, the electrode unit 112 includes at least two electrodes 1121, 1122 (i.e., a first electrode 1121 and a second electrode 1122) disposed on the chip second surface S22. In certain embodiments, the two electrodes 1121, 1122 are disposed on a same side of the semiconductor stack. In this embodiment, the first electrode 1121 is electrically connected to the first semiconductor layer 1111, and the second electrode 1122 is electrically connected to the second semiconductor layer 1112.

To reduce a size of the LED packaging module 100, in some embodiments, the LED chips 111 are spaced apart a distance not greater than about 100 μm. In some other embodiments, the LED chips 111 are spaced apart by a distance that ranges from about 50 μm to about 100 μm. In yet some other embodiments, the LED chips 111 are spaced apart by a distance not greater than about 50 μm. In certain embodiments, the LED chips 111 are spaced apart by, for example, but not limited to, a distance, e.g., 40 μm to 50 μm, 30 μm to 40 μm, 20 μm to 30 μm, 15 μm to 20 μm, or not greater than about 15 μm. The smaller the distance among the LED chips 111, the smaller the size of the LED packaging module 100, thereby improving the resolution of a display panel. In some lighting applications, reducing the distance (i.e., spacing) among the LED chips 111 can improve the area ratio of the LED chip 111 to the LED packaging module 100 (i.e., a ratio of a surface area of the chip first surfaces S21 of the LED chips 111 to an area of a surface of the LED packaging module 100 parallel to the chip first surfaces S21, such as a second encapsulating surface S12 shown in FIG. 1).

Figure 3A:
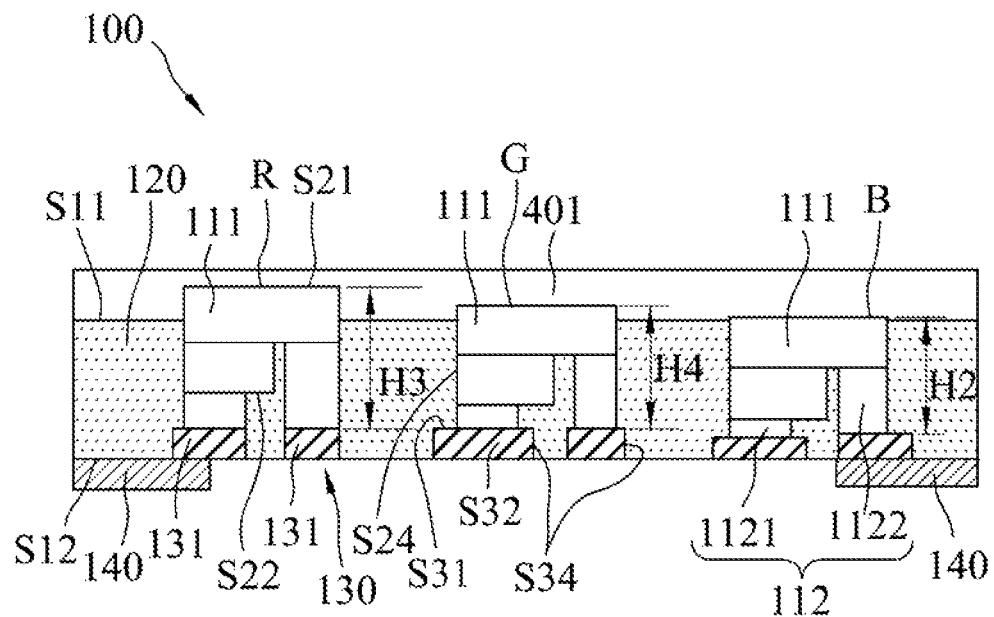
FIG. 3A is a cross-sectional view of the first embodiment of the LED packaging module.
Figure 3B:
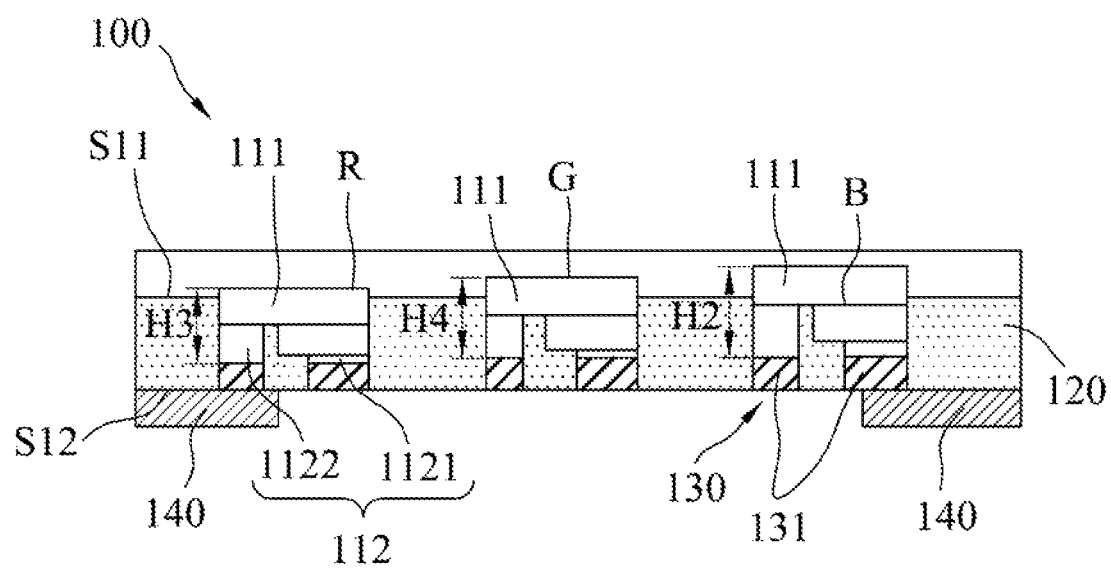
FIG. 3B is a cross-sectional view of a variation of the first embodiment of the LED packaging module.

As shown in FIG. 3A, the wiring layer 130 is disposed on the chip second surfaces S22 of the LED chips 111, and has a first wiring layer surface S31 adjacent to the LED chips 111, a second wiring layer surface S32 opposite to the first wiring layer surface S31, and a side wiring layer surface S34 connected to the first wiring layer surface S31 and the second wiring surface S32. The wiring layer 130 is divided into a plurality of wiring parts 131 that are spaced apart from each other. The first wiring layer surface S31 contacts and is electrically connected to the electrode units 112 of the LED chips 111.

The wiring layer 130 electrically connects the LED chips 111 in series or in parallel, and can electrically connect the electrode unit 112 of each of the LED chips 111 to other elements such as a circuit board (not shown), so that electrical connection between the LED chips 111 and another electronic component (not shown) is made to be more convenient. The wiring layer 130 is divided into a plurality of wiring parts 131, and the encapsulant component 120 fills gaps among the wiring parts 131 so that the wiring parts 131 are separated from each other by the encapsulant component 120. In some embodiments, the wiring layer 130 is divided into at least two wiring parts 131. In certain embodiments, the wiring layer 130 is made of a material that has a melting point greater than about 400° C., which is beneficial for improving the reliability of the wiring layer 130. In certain embodiments, the wiring layer 130 is made of a material, e.g., Cu, Cu$_x$W, or other conductive metals. In certain embodiments, the wiring layer 130 is formed using electroplating or electroless plating, and is directly and electrically connected to each of the LED chips 111 such that no eutectic soldering or reflow soldering process is required. Therefore, no solder layer is disposed between the wiring layer 130 and the electrode units 112 of the LED chips 111, that is, connection between the wiring layer 130 and the LED chips 111 is free of a soldering connection.

The encapsulant component 120 covers the LED chips 111 and the wiring layer 130, and fills gaps among the LED chips 111 and gaps among the wiring parts 131 (as mentioned above). The encapsulant component 120 includes a first encapsulating surface S11 and the second encapsulating surface S12 opposite to the first encapsulating surface S11. The first encapsulating surface S11 of the encapsulant component 120 faces in a same direction as the chip first surfaces S21 of the LED chips 111 (see FIG. 1). The second encapsulating surface S12 of the encapsulant component 120 faces in a same direction as the second wiring layer surface S32 of the wiring layer 130 (see FIG. 2). In some embodiments, the encapsulant component 120 is opaque or has low light transmittance, e.g., the encapsulant component 120 has a light transmittance lower than about 30% or ranges from about 5% to about 20%.

In some embodiments, when the LED packaging module 100 is used for display applications, the encapsulant component 120 may be made of, for example, but not limited to, epoxy resin, silica gel, or other commonly used resins for a packaging process, and is made to be opaque or has a low light transmittance (e.g., dispersed with a light-absorbing material). The encapsulant component 120 may include a light-absorbing material that at least surrounds the chip side surface S24 of each of the LED chips 111, and that is disposed between the adjacent LED chips 111. In some embodiments, the light-absorbing material at least surrounds the semiconductor stack and is disposed between adjacent semiconductor stacks. In some embodiments, the light-absorbing material may be light-absorbing particles dispersed in the encapsulant component 120. The light-absorbing material may be, for example, but not limited to, black particles (e.g., carbon powder) or black resin. The position of the light-absorbing material of the encapsulant component 120 (i.e., at least surrounds the chip side surface S24 of each of the LED chips 111) may prevent light from emitting outwardly from the chip side surface S24 of each of the LED chips 111, thereby ensuring that light mainly concentrates on the light-exiting surface (i.e., the chip first surface S21) of the LED chips 111. Thus, optical crosstalk or light mixing of the LED chips 111 may be reduced, thereby increasing contrast of the LED packaging module 100.

In order to ensure that light emits mainly from the light-exiting surface (i.e., the first chip surface S21 of each of the LED chips 111) so that the LED chips 111 achieve good luminous efficiency, light emitted from the chip side surface S24 of the LED chip 111 has to be absorbed as much as possible by the light-absorbing material in the encapsulant component 120. The light-absorbing material is opaque and does not reflect light. The light-absorbing material may be a black glue, but not limited thereto. Moreover, the height differences (H1) among the chip first surfaces S21 of the LED chips 111 is controlled to be as small as possible. The chip first surfaces S21 of at least two of the LED chips 111 have a height difference (H1) that is greater than 0 µm and not greater than about 15 µm. In some embodiments, the height difference (H1) between the chip first surfaces S21 of at least two of the LED chips 111 is greater than 0 µm and smaller than about 5 µm.

FIG. 2 is a perspective view of the first embodiment of the LED packaging module 100 seen from a side opposite to that shown in FIG. 1. Referring back to FIG. 2 and further to FIG. 3A, the welding pads 140 are disposed on the second encapsulating surface S12 of the encapsulant component 120, and are electrically connected to the wiring layer 130. That is, at least a part of the second wiring layer surface S32 of the wiring layer 130 may be exposed from the encapsulant component 120, and may be connected to the welding pads 140. Large-sized welding pads 140 may be used in back-end processing of the LED packaging module 100. However, it should be noted that the welding pads 140 may not be necessary in the LED packaging module 100. Since the wiring layer 130 is divided into the wiring parts 131, at least one of the wiring parts 131 of the wiring layer 130 may be directly used as a welding pad for electrical connection of the LED chips 111 to an electronic element, such as a circuit board (not shown). As such, it may not be necessary to form the welding pads 140 on the encapsulant component 120. The number of the welding pads 140 is not limited, and an appropriate number of welding pads 140 may be required according to the relationship of electrical connection between the LED chips 111. For example, in some embodiments, when three of the LED chips 111 are designed to be electrically connected in parallel, at least four of the welding pads 140 are required (as shown in FIG. 2 and hereinafter in FIG. 12).

As shown in FIG. 3A, in some embodiments, the LED packaging module 100 further includes a light-transmitting layer 401 that covers the chip first surfaces S21 of the LED chips 111. The light-transmitting layer 401 may cover the first encapsulating surface S11 of the encapsulant component 120. In some embodiments, the light-transmitting layer 401 may include a light-transmitting material such as resin or silica gel, and has a light transmittance of not less than about 40% or between about 40% and about 80%. In some other embodiments, the light transmittance of the light-transmitting layer 401 may be greater than about 80%. The light-transmitting layer 401 may include a light-scattering material, such as scattering particles. The scattering material may be, for example, but not limited to, a glass material, a sapphire material, or the like, or combinations thereof. The light-transmitting layer 401 seals the chip first surfaces S21 of the LED chips 111 to protect the chip first surfaces S21 of the LED chips 111. The light-transmitting layer 401 may serve as a light-scattering lens to produce a light-scattering effect, so that, when the LED packaging module 100 is used for display, the feeling of vertigo can be effectively reduced.

According the display requirements, the LED chips 111 have different radiation wavelengths. In this embodiment, at least two of the LED chips 111 have different wavelengths. In some embodiments, the LED packaging module 100 includes at least three LED chips 111. To be specific, the LED chips 111 include a first LED chip, a second LED chip, and a third LED chip, and the first LED chip is a red LED chip (R), the second LED chip is a green LED chip (G), and the third LED chip is a blue LED chip (B) (see FIGS. 1 and 3). In some embodiments, the first semiconductor layer 1111 and the second semiconductor layer 1113 of the blue LED chip (B) and the green LED chip (G) may be made of a nitride material having the formula of $Al_xIn_yGa_{1-x-y}N$, in which x and y satisfy the relationships: $0 \le x \le 1$, $0 \le y \le 1$, and $0 \le x+y \le 1$. In some embodiments, the first semiconductor layer 1111 and the second semiconductor layer 1113 of the red LED chip (R) may be made of a phosphide material having the formula of $Al_zIn_wGa_{1-z-w}P$, in which z and w satisfy the relationships: $0 \leq z \leq 1$, $0 \leq w \leq 1$, and $0 \leq z+w \leq 1$. The active layer 1112 of the blue and green LED chips (B, G) may include a multi-quantum well (MQW) structure which has quantum well layers and quantum barrier layers that are alternately stacked. In some embodiments, the quantum well layers and the quantum barrier layers of the MQW structure of the active layer 1112 of the blue and green LED chips (B, G) may be nitride-based layers, e.g., an InGaN/GaN layer, an InGaN/AlGaN layer, etc. By adjusting the relative content of In, Al, and Ga in the active layer 1112, the emission wavelengths of the blue and green LED chips (B, G) can be effectively adjusted. In some embodiments, the quantum well layers and the quantum barrier layers of the MQW structure of the active layer 1112 of the red LED chip R may be, but not limited to, an InGaP/GaP layer, a GaP/AlGaP layer, or an AlGaInP/AlGaInP layer (AlGaInP sub-layers in the AlGaInP/AlGaInP layer has different contents of Al, Ga, In, P). By adjusting the relative content of Al, Ga, and In in the active layer 1112, the emission wavelength of the red LED chip (R) can be effectively adjusted.

An appropriate light output ratio of the LED chips 111 is required so as to meet different color temperature requirements for display applications. Generally, it is difficult for the red, green, and blue LED chips (R, G, B) to meet the absolute light output ratio requirements through a chip manufacturing process. Therefore, in the LED packaging module 100 of the present disclosure, the chip first surfaces S21 of the red, green, and blue LED chips R, G, B are adjusted so that there are certain height differences thereamong. Through the height differences among the chip first surfaces S21 and the light-transmitting layer 401 disposed on the chip first surfaces S21, which serves as an optical lens, light emitted from the LED chips 111 can be partially absorbed or scattered, and thus, light output ratio of the LED chips (R, G, B) can be adjusted to meet the color temperature requirements for RGB display applications. In some embodiments, the height difference (H1) of the chip first surfaces S21 of at least two of the LED chips R, G, B is greater than 0 μm, but not greater than about 15 μm. The LED chips 111 may be micro LED chips. For micro LED chips, the height difference (H1) of the chip first surfaces S21 of at least two of the LED chips R, G, B is greater than 0 μm, but not greater than about 5 μm. In alternate embodiments, for micro LED chips, the height difference (H1) of the chip first surfaces S21 of at least two of the LED chips R, G, B is greater than 0 μm, but not greater than about 3 μm, or not greater than about 2 μm, or not greater than about 1 μm. An excessive height difference may cause optical crosstalk among the chip side surfaces S24 of the adjacent LED chips (R, G, B).

The second encapsulating surface S12 of the encapsulant component 120 and the second wiring layer surface S32 are situated at a same side of the encapsulant component 120. In certain embodiments, the second encapsulating surface S12 of the encapsulant component 120 is flush with the second wiring layer surface S32 (see FIG. 3A). In certain embodiments, the chip first surface S21 of the blue LED chip (B) has a surface height (H2), the chip first surface S21 of the red LED chip (R) has a surface height (H3), and the chip first surface S21 of the green LED chip (G) has a surface height (H4). The surface heights (H2, H3, H4) are measured from the first wiring layer surface S31 of the wiring layer 130. In certain embodiments, the surface height (H2) of the chip first surface S21 of the blue LED chip (B) is smaller than the surface heights (H4, H3) of the chip first surfaces S21 of the green LED chip (G) and the red LED chip (B). In certain embodiments, the surface height (H2) is smaller the surface height (H4), and the surface height (H4) is smaller than the surface height (H3). In some embodiments, the height difference (|H3−H2|) between the chip first surface S21 of the blue LED chip (B) and the chip first surface S21 of the red LED chip (R) is about 5 μm, and the height difference (|H4−H2|) between the chip first surface S21 of the green LED chip (G) and the chip first surface S21 of the blue LED chip (B) is about 1 μm. In some other embodiments, the surface height (H3) of the chip first surface S21 of the red LED chip (R) is smaller than the surface heights (H4, H2) of the chip first surfaces S21 of the green LED chip (G) and the blue LED chip (B) (see a variation of the first embodiment shown in FIG. 3B). The thickness of the light-transmitting layer 401 is greater than the height differences (|H3−H2|, |H4−H3|, |H4−H2|) among the chip first surfaces S21 of the three LED chips (R, G, B), so that the light-transmitting layer 401 completely covers the chip first surfaces S21 of the three LED chips (R, G, B). In this embodiment, the thickness of the light-transmitting layer 401 is about 15 μm, and the chip first surface S21 of the blue LED chip (B) is flush with the first encapsulating surface S11 of the encapsulant component 120. In some embodiments, the LED packaging module 100 has a thickness ranging from about 100 μm to about 500 μm.

Figure 5:
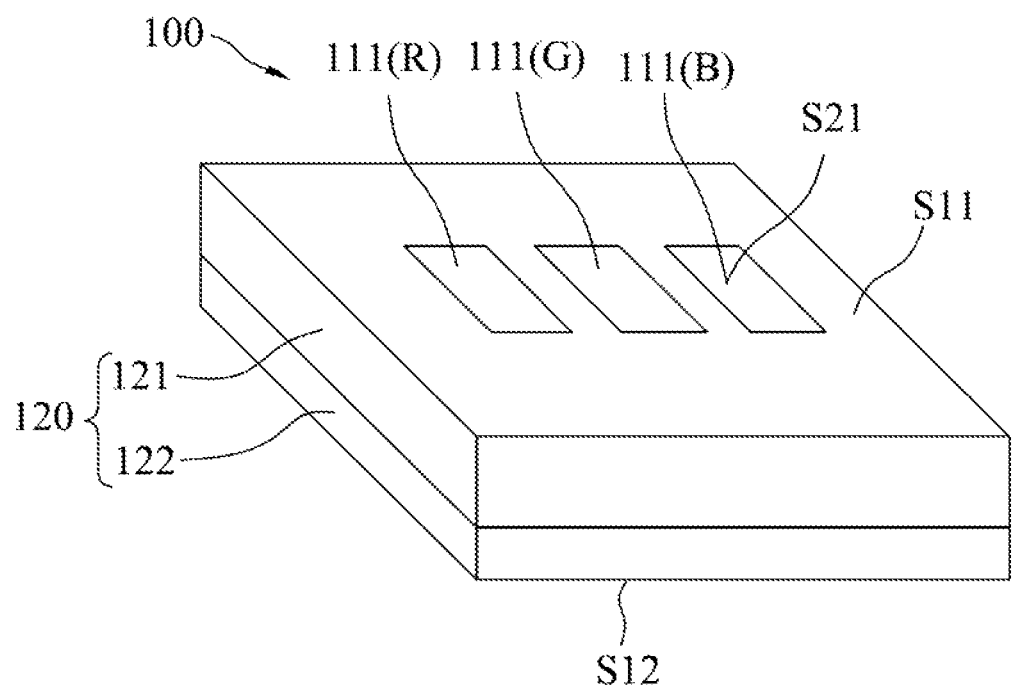
FIG. 5 is a perspective view of a second embodiment of the LED packaging module according to the present disclosure.
Figure 6:
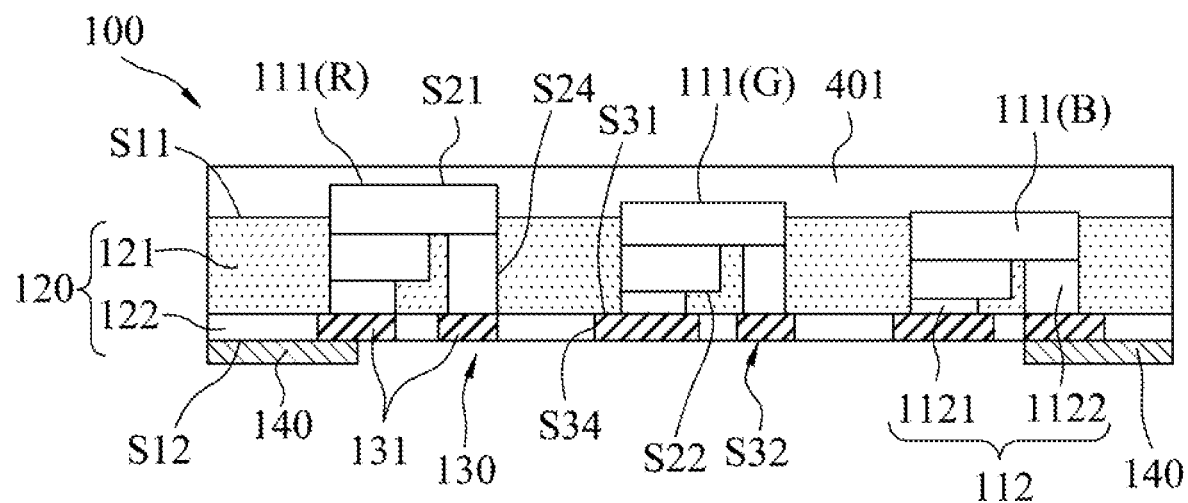
FIG. 6 is a cross-sectional view of the second embodiment of the LED packaging module.

Referring to FIGS. 5 and 6, a second embodiment of the LED packaging module 100 of the present disclosure is provided. The second embodiment of the LED packaging module 100 is similar to the first embodiment, except that in the second embodiment, the encapsulant component 120 includes at least two layers. One of the layers of the encapsulant component 120 that fills gaps among the LED chips 111 includes a light-absorbing material. In this embodiment, the encapsulant component 120 has a first encapsulating layer 121 and a second encapsulating layer 122. The first encapsulating layer 121 covers the chip side surface S24 (i.e., fills in gaps among the LED chips 111) and the chip second surface S22 of each of the LED chips 111. In some embodiments, the first encapsulating layer 121 may be made of a material the same as that of the encapsulating layer 120 of the first embodiment, and may include a light-absorbing material. The light-absorbing material may be the same as that of the first embodiment. The light-absorbing material surrounds at least the semiconductor stack. The second encapsulating layer 122 covers the side wiring layer surface S34 of the wiring layer 130, and fills gaps among the wiring parts 131. The second encapsulating layer 122 may be made of a material that is the same as or different from that of the first encapsulating layer 121. In some embodiments, the second encapsulating layer 122 does not include the light-absorbing material, and may be a light-transmitting layer. The light-transmitting layer may be made from silica gel or epoxy resin so as to ensure reliability of the second encapsulating layer 122. In some embodiments, the light transmittance of the second encapsulating layer 122 is not less than that of the first encapsulating layer 121. In some other embodiments, the light transmittance of the second encapsulating layer 122 is greater than that of the first encapsulating layer 121.

Since the wiring layer 130 is integrated in the encapsulant component 120 of the packaging module 100, wire bonding or the use of a solder paste is not required, which can effectively increase an area ratio of the ZED chips 111 to the encapsulant component 120. In addition, by integrating the wiring layer 130 in the encapsulant component 120, the number of the welding pads 140 may be minimized. The size of the welding pads 140 may be enlarged to reduce complexity of circuit design needed in back-end applications and to facilitate connection of the LED packaging module 100 with an external device. The aforesaid designs can easily and effectively reduce the size of the LED packaging module 100.

Figure 7:
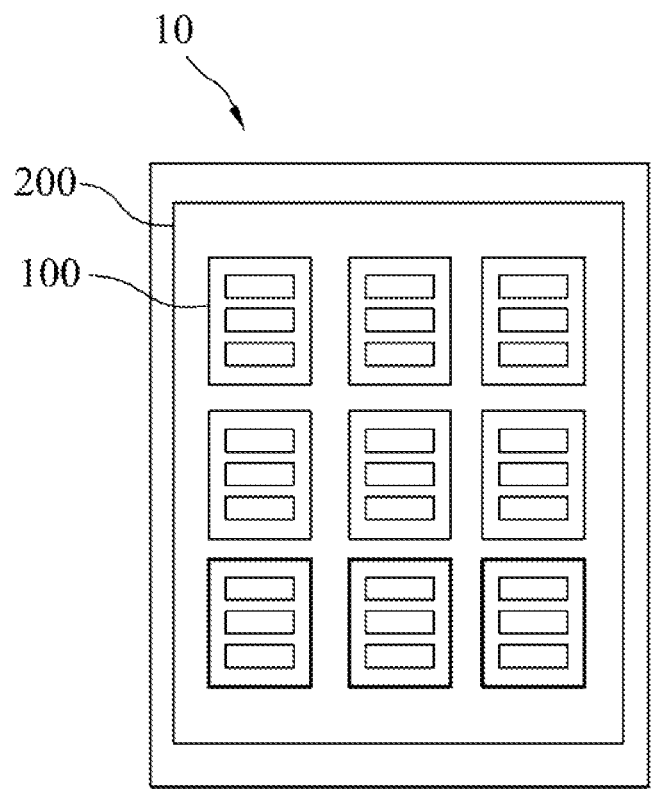
FIG. 7 is a top view of a display device including the LED packaging module of the present disclosure.

FIG. 7 is a top view of a display device 10 including at least one of the LED packaging modules 100 of the present disclosure. In this embodiment, the display device 10 is a display panel. The display panel 10 may include a circuit board 200 and a plurality of the LED packaging modules 100 disposed on the circuit board 200, and each of the LED packaging modules 100 may emit red light, green light, and blue light. Each of the LED packaging modules 100 may be a single pixel of the display panel 10, and the LED packaging modules 100 may be arranged on the circuit board 200 in multiple rows and multiple columns.

The red LED chip (R), the green LED chip (G), and the blue LED chip (B) in the LED packaging module 100 correspond to sub-pixels of a RGB LED light source. The sub-pixel has a wavelength that is not limited to red, green, or blue light wavelength. In this embodiment, the encapsulant component 120 of the LED packaging module 100 includes, for example, but not limited to, epoxy resin or silica gel mixed with black particles, so that the LED packaging modules 100 is black-colored except for the chip first surface S21 (i.e., the light-exiting surface) of the LED chips 111, which helps to improve the display contrast of the display panel 10 and to reduce optical interference among the LED chips 111. When the first embodiment of the LED packaging module 100 (see FIGS. 1 to 3) or the second embodiment of the LED packaging module 100 (see FIGS. 5 to 6) is used as a pixel in the display panel 10, the pixel pitch of the display panel 10 can reach about 1 mm or less.

Referring to FIGS. 8 to 13, a method for making a variation of the first embodiment of the LED packaging module 100 of the present disclosure is disclosed.

Figure 8:
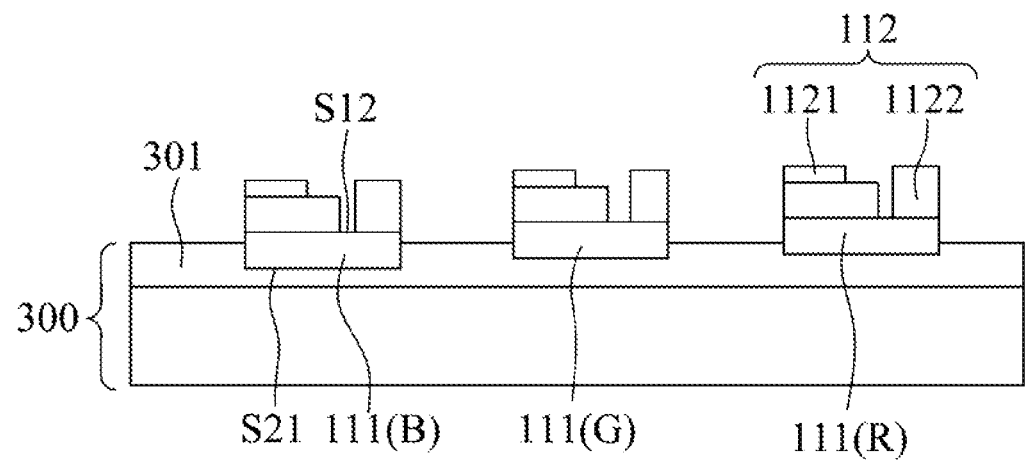
FIGS. 8 to 12 are schematic views illustrating intermediate states of a method for making the first embodiment of the LED packaging module according to the present disclosure.

First, referring to FIG. 8, three LED chips R, G, B are provided. Each of the LED chips R, G, B has the chip first surface S21, the chip second surface S22 opposite to the chip first surface S21, the chip side surface S24 connected to the chip first surface S21 and the chip second surface S22, and the electrode unit 112 disposed on the chip second surface S22. The three LED chips R, G, B are arranged such that the electrode units 112 of the LED chips R, G, B are located on a same side of the LED chips R, G, B. In certain embodiments, the electrode units 112 are disposed on the chip second surfaces S22 of the LED chips R, G, B such that the electrode units 112 are located along the direction facing the chip second surfaces S22. In this embodiment, the LED chips R, G, B have different wavelengths of red, green, and blue lights, respectively. The chip first surfaces S21 of the LED chips R, G, B are fixed on a first temporary substrate 300 that includes an adhesive layer 301 for fixing the LED chips R, G, B. The chip first surfaces S21 of the LED chips R, G, B face toward and contact the adhesive layer 301 so that the chip first surfaces S21 of the LED chips R, G, B face the same direction.

By applying appropriate pressures on the LED chips R, G, B, different elastic deformations of the adhesive layer 301 can be achieved accordingly so as to achieve the height differences among the LED chips R, G, B. The adhesive layer 301 has a thickness not greater than about 15 μm so that the height differences (H1) among the chip first surfaces S21 of the LED chips R, G, B can be controlled to be greater than 0 μm and smaller than about 15 μm. The adhesive layer 301 may be, for example, but not limited to, a pyrolyzable glue layer, a photo-decomposable glue layer, or a double-sided tape.

Figure 9:
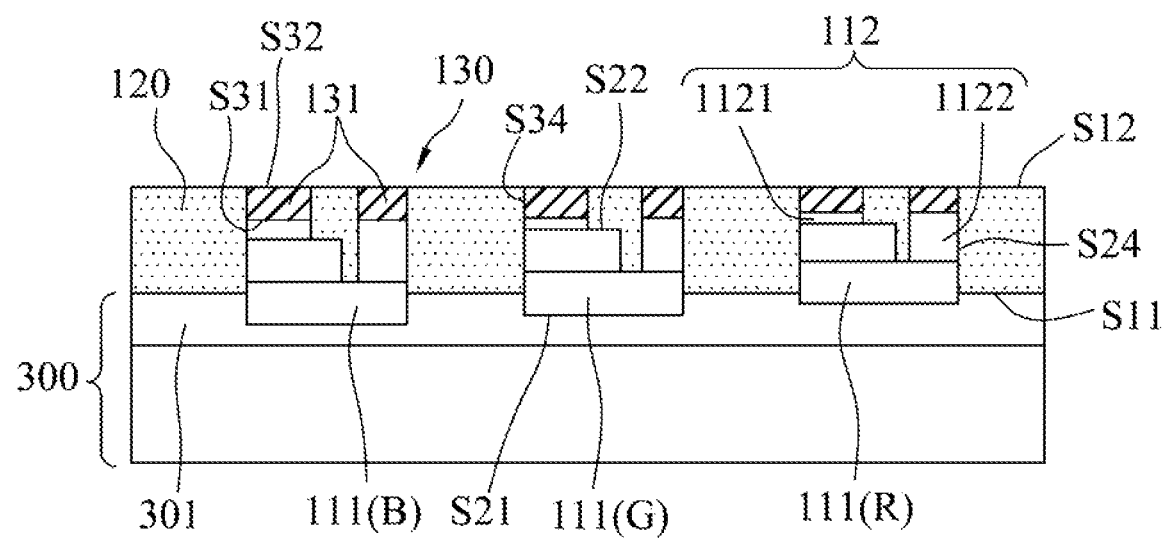

Next, as shown in FIG. 9, the wiring layer 130 is formed on the chip second surfaces S22 of the LED chips R, G, B as wiring parts 131, and the encapsulant component 120 is formed to cover the wiring layer 130 and the LED chips R, G, B. To be specific, the encapsulant component 120 fills gaps among the LED chips R, G, B, and gaps among the wiring parts 131, thereby fixedly connecting the LED chips R, G, B and exposing at least a part of the second wiring layer surface S32 of the wiring layer 130.

The encapsulant component 120 is formed to cover the chip side surfaces S24 of the LED chips R, G, B, and the second encapsulating surface S12 of the encapsulant component 120 is formed to be flush with the second wiring layer surface S32 of the wiring layer 130. In some embodiments, the encapsulant component 120 may be formed by hot compression molding to completely cover the electrode units 112 of the three LED chips R, G, B. Then, the electrode units 112 of the LED chips R, G, B may be exposed through a patterning process. The wiring layer 130 may then be formed on the electrode units 112 by electroplating or electroless plating of a metal layer.

Figure 10:
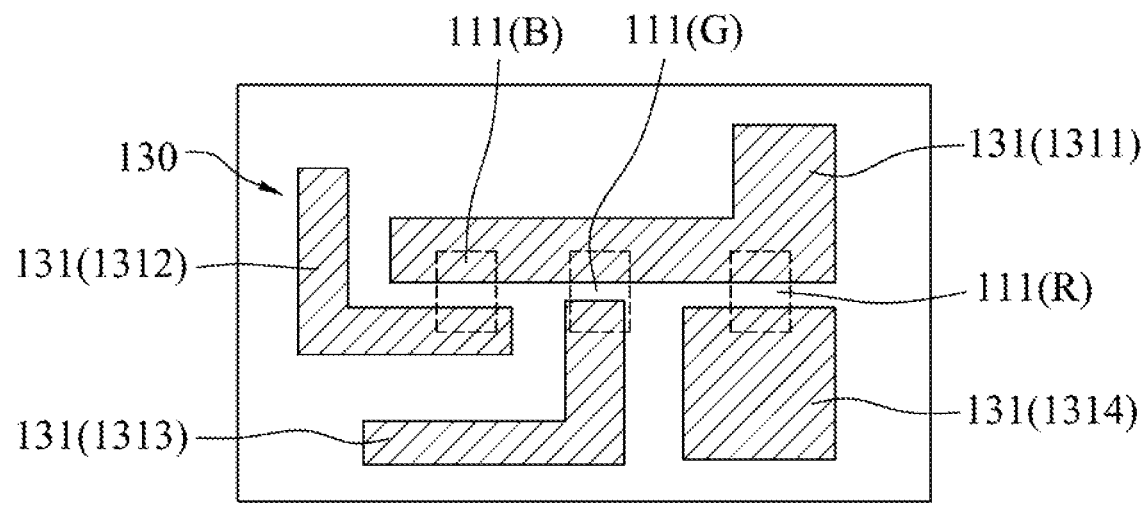

The three LED chips R, G, B are electrically connected in parallel by the wiring layer 130. The design of the wiring layer 130 is schematically shown in FIG. 10. In this embodiment, the wiring layer 130 is divided into at least four wiring parts 131, i.e., a first wiring part 1311, a second wiring part 1312, a third wiring part 1313, and a fourth part 1314. The first wiring part 1311 connects one of the first and second electrodes 1121, 1122 of all of the three LED chips R, G, B, and each of the second, the third, and the fourth wiring parts 1312, 1313, 1314 is connected to the other one of the first or second electrodes 1121, 1122 of a respective one of the three LED chips 111. In some embodiments, the wiring layer 130 includes two or more sub-layers, and each sub-layer may have a different pattern. The sub-layers of the wiring layer 130 may be connected to at least one of the first and second electrodes 1121, 1122 of each of the LED chips R, G, B, and extends to an area outside of the electrode units 112 of the LED chips 11.

Figure 11:
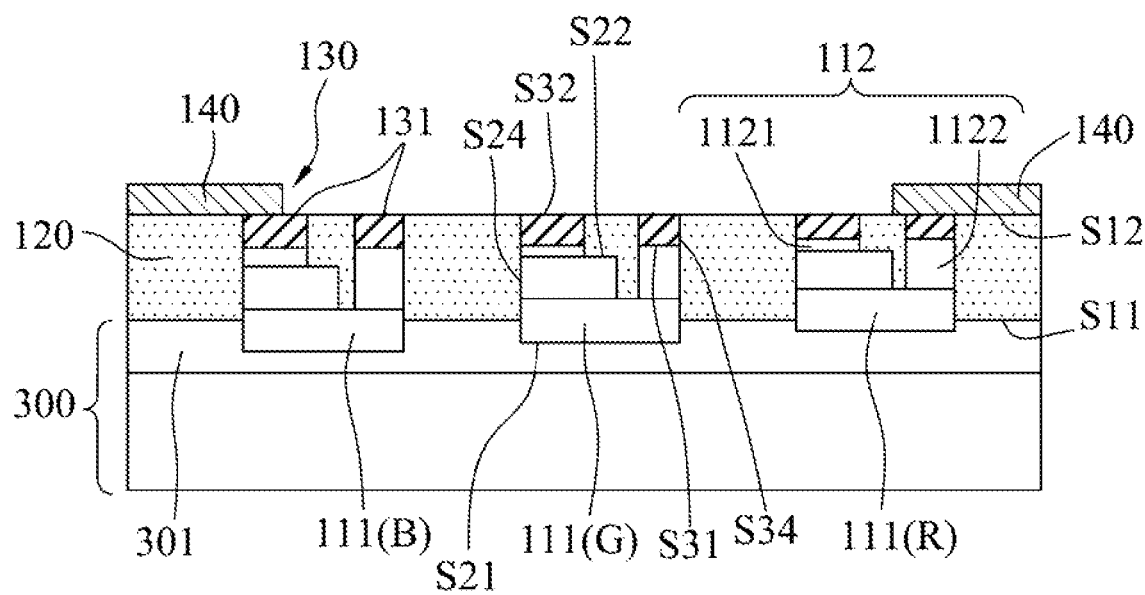
Figure 12:
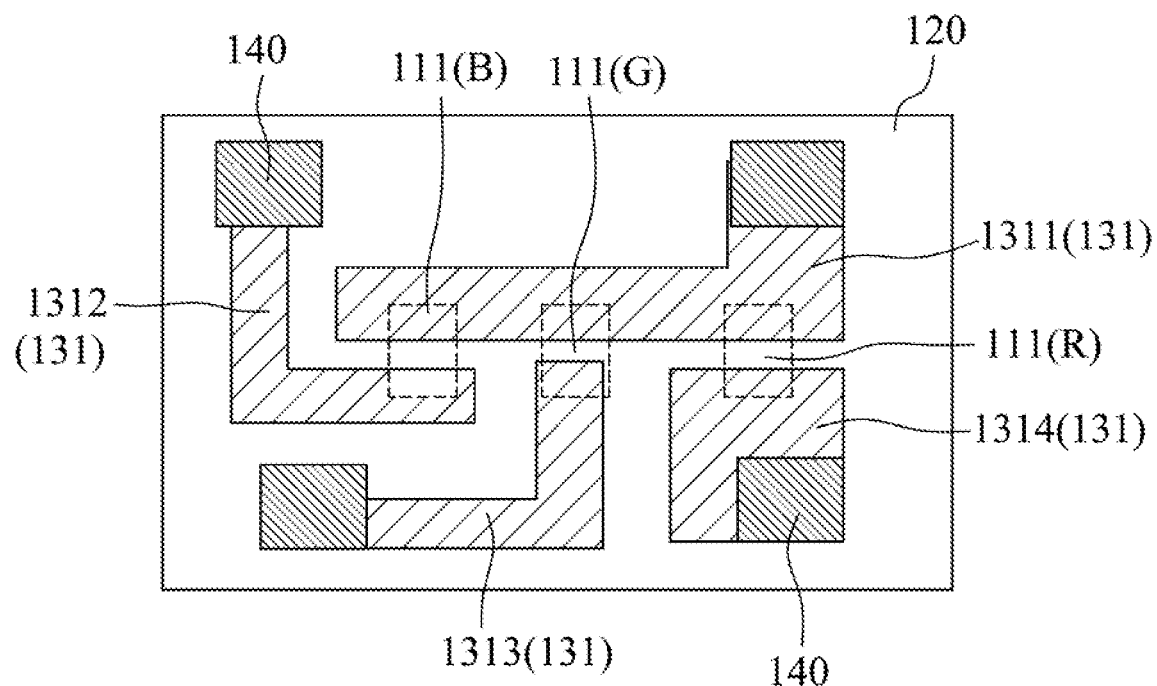
Figure 13:
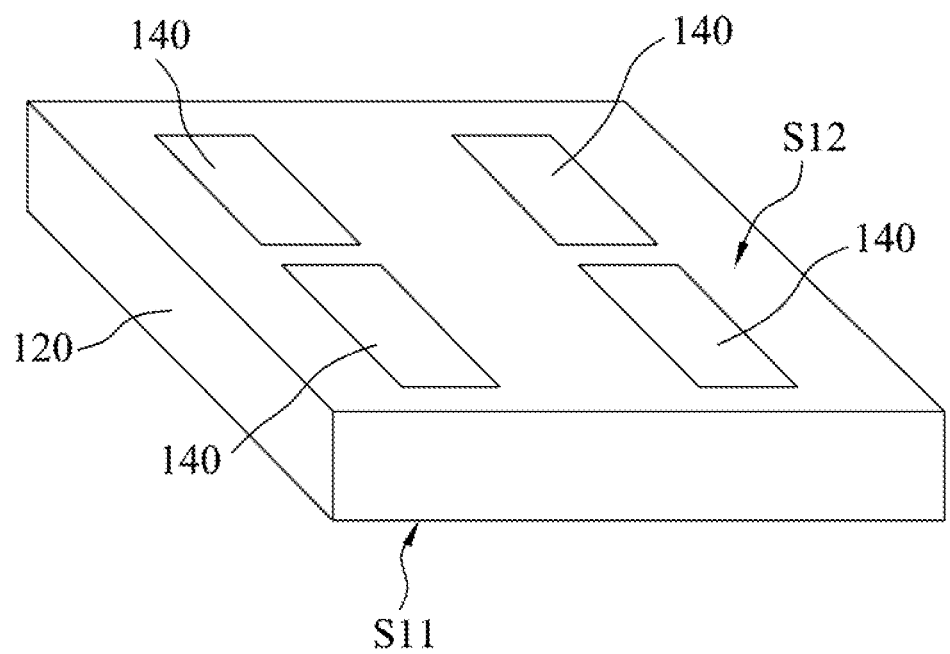
FIG. 13 is a perspective view illustrating an intermediate state of the method for making the first embodiment of the LED packaging module.

Referring to FIGS. 11 to 13, the welding pads 140 are formed on the second encapsulating surface S12 of the encapsulant component 120, and are electrically connected to a part of the second wiring layer surface S32 of the wiring layer 130. FIG. 12 is a top view of a structure shown in FIG. 11. The encapsulating component 120 seals the LED chips R, G, B, and the wiring layer 130 is integrated inside the encapsulant component 120. The welding pads 140 may have a connection area greater than that of the electrode units 112 of the LED chips R, G, B.

After forming the welding pads 140, a transfer process is performed so that the LED packaging module 100 is transferred onto a second temporary substrate (not shown), and the first temporary substrate 300 is removed to expose the chip first surfaces S21 of the LED chips R, G, B that have different surface heights relative to the second encapsulating surface S12.

The light-transmitting layer 401 may then be formed to cover the chip first surfaces S21 of the LED chips R, G, B, and the first encapsulating surface S11 of the encapsulant component 120. The light-transmitting layer 401 may have a thickness that ranges between about 5 μm and about 20 μm, and that is larger than the surface height of the chip first surfaces S21 of the LED chips R, G, B. In some embodiments, black glue is applied to the first surface S21 of at least one of the LED chips R, G, B to reduce the brightness and glare of the LED chips R, G, B, and to control the light output ratio of the LED chips R, G, B.

Figure 14:
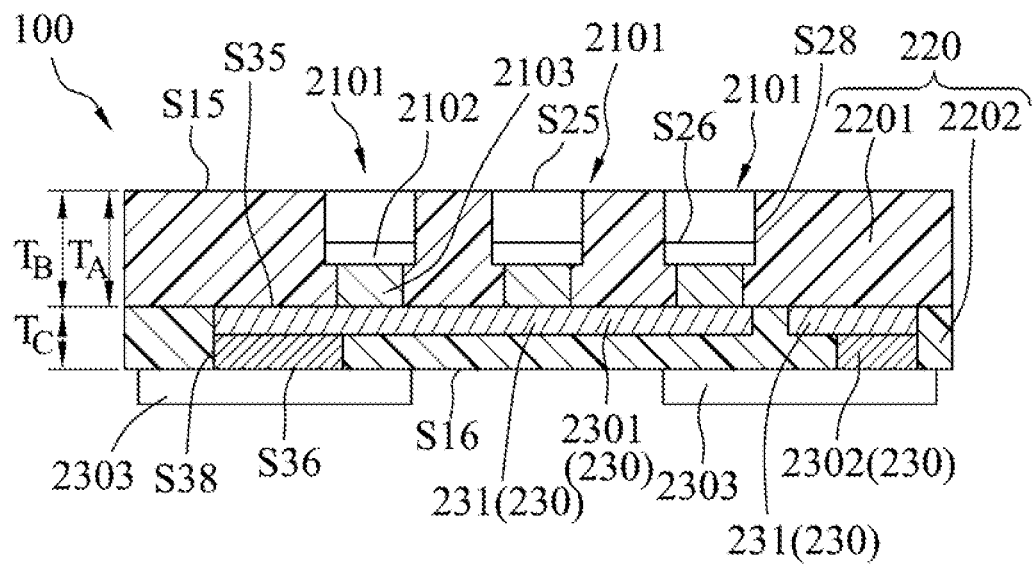
FIG. 14 is a cross-sectional view of a third embodiment of the LED packaging module according to the present disclosure.

Referring to FIG. 14, a third embodiment of the LED packaging module 100 according to the present disclosure is provided. FIG. 14 is a cross-sectional view of the third embodiment of the LED packaging module 100. The third embodiment of the LED packaging module 100 includes a plurality of LED chips 2101 spaced apart from each other, a wiring layer 230 and an encapsulant component 220. The LED chips 2101 includes a chip first surface S25 as a light-exiting surface, a chip second surface S26 opposite to the chip first surface S25, and a chip side surface S28 that connects to the chip first surface S25 and the chip second surface S26, and an electrode unit 2102 disposed on the chip second surface S26. The wiring layer 230 is disposed on the LED chips 2101, and has a first wiring layer surface S35 adjacent to the LED chips 2101, a second wiring layer surface S36 opposite to the first wiring layer surface S35, and a side wiring layer surface S38 connected to the first wiring layer surface S35 and the second wiring layer surface S36. The first wiring layer surface S35 is electrically connected to the electrode units 2102 of the LED chips 2101. The wiring layer 230 is divided into a plurality of wiring parts 231. The encapsulant component 220 includes a first encapsulating layer 2201 formed to cover the chip side surfaces S28 of the LED chips 2101, and a second encapsulating layer 2202 which is formed to cover the side wiring layer surface S38 of the wiring layer 230, which fills gaps among the wiring parts 231, and which exposes at least a part of the second wiring layer surface S36 of the wiring layer 230. In certain embodiments, the first encapsulating layer 2201 covers the chip second surface S22 of each of the LED chips 2101. The encapsulant component 220 has a first encapsulating surface S15 and a second encapsulating surface S16 opposite to the first encapsulating surface S15. The first encapsulating surface S15 faces in a same direction as the chip first surfaces S25 of the LED chips 2101. In this embodiment, each of the LED chips 2101 has a thickness $T_A$, the first encapsulating layer 2201 has a thickness $T_B$, and has a thickness $T_C$, and $T_A$ and $T_B$ satisfy a relationship: $T_B/T_A \geq 1$. To be noted is that, the thicknesses $T_A$ of the LED chips 2101 may be different from one another, and the thickness difference(s) is not depicted in FIG. 14 for the sake of simplicity. In FIG. 14, the thickness $T_A$ of one of the LED chips 2101 is substantially the same as the thickness $T_B$ of the first encapsulating layer 2201.

Each of the LED chips 2101 may be one of a regular-sized LED chip (generally refers to a chip having a side length of more than about 200 μm), a mini LED chip (generally refers to a chip having a size that range from 100 μm to 200 μm), and a micro LED chip (generally refers to a chip having a size not greater than about 100 μm). In this embodiment, the LED chips 2101 are mini LED chips. In some other embodiments, the LED chips 2101 may be similar to the LED chips 111 of the first embodiment of the present disclosure.

In this embodiment, the third embodiment of the LED packaging module 100 according to the present disclosure includes three of the LED chips 2101 having different wavelengths. In certain embodiments, the three of the LED chips 2101 include one red LED chip (R), one green LED chip (G), and one blue LED chip (B). The LED chips 2101 may further include a white LED chip (W, not shown) having a wavelength conversion layer so as to form an RGBW combination, which can improve the brightness of a display device and is beneficial for outdoor display.

In this embodiment, each of the LED chips 2101 may further include a thickened electrode 2103 which is formed on the electrode unit 2102 by, e.g., electroplating, electroless plating, or printing. The thickened electrode 2103 may include, but not limited to, Cu, $Cu_xW$, or other conductive metals. By having the thickened electrode 2103, a contact area between the chip side surfaces S28 of the LED chips 2101 and the first encapsulating layer 2201 can be increased, thereby increasing adhesion between the LED chips 2101 and the encapsulant component 220. Moreover, the thickened electrode 2103 and the first encapsulating layer 2201 may form a mortise-tenon structure so that the LED chips 2101 can be firmly fixed by the encapsulant component 220.

The wiring layer 230 includes a first sub-wiring layer 2301, and a second sub-wiring layer 2302. The first sub-wiring layer 2301 is used to electrically connect the LED chips 2101. The LED chips 2101 may be electrically connected in series, in parallel, or a combination thereof. The second sub-wiring layer 2302 is used to simplify the wiring structure, that is, to reduce the number of electrical connection terminals. The LED packaging module of the third embodiment of the present disclosure further includes a plurality of welding pads 2303 that are disposed on the second encapsulating layer 2202 and that are electrically connected to the second sub-wiring layer 2302 (i.e., connected to the second wiring layer surface S36 of the wiring layer 230).

The first encapsulating layer 2201 and the second encapsulating layer 2202 may be made of the same or different material. When the first encapsulating layer 2201 and the second encapsulating layer 2202 are made of the same material, the two layers (i.e., the first and second encapsulating layers 2201, 2202) may be combined into one layer or may be integrated as one layer. In certain embodiments, the first encapsulating layer 2201 may include a light-absorbing material, and may have a light transmittance not greater than that of the second encapsulating layer 2202. In some embodiments where the LED packaging module 100 is used in a display device, the first and second encapsulating layers 2201, 2202 are made of epoxy resin or silica gel dispersed with black particles, and the encapsulant component 220 fixes and seals the LED chips 2101 in the LED packaging module 100, which can suppress the optical interference among the LED chips 2101.

In some embodiments, the thickness $T_A$ of each the LED chips 2101 and the thickness $T_B$ of the first encapsulating layer 2201 satisfy the relationship: $T_B/T_A \geq 1$. In this embodiment, the thickness $T_A$ of the LED chips 2101 ranges between about 40 μm and about 100 μm, the thickness $T_B$ of the first encapsulating layer 2201 ranges between about 120 μm and about 200 μm, and the thickness $T_C$ of the wiring layer 230 ranges between about 20 μm and about 200 μm. In certain embodiments, the thickness $T_C$ of the wiring layer 230 ranges between about 40 μm and about 180 μm. $T_A$, $T_B$ and $T_C$ satisfy the relationship: $1.4 \leq (T_B+T_C)/T_A \leq 10$. It should be noted that the wiring layer 230 may have multiple layers, which can be at least 2 layers, or 4 layers, and, in some embodiments, each layer may have a thickness of about 30 μm.

A method for making the third embodiment of the LED packaging module 100 is disclosed hereinafter. After providing the LED chips 2101, the first encapsulating layer 2201 is formed to fix the LED chips 2101. After forming the first encapsulating layer 2201, the wiring layer 230 are formed. Then, the second encapsulating layer 2202 is formed to wrap the wiring layer 230, and an encapsulant structure is thereby obtained. This method does not require use of wires, which improves reliability and contrast of the LED packaging module 100. Since the LED chips 2101 do not need solder paste, the wiring layer 230 connected to the LED chips 2101 is free of a solder layer, which avoids undesired chip soldering problems and secondary reflow soldering, thereby achieving a smaller packaging module size and a higher degree of integration.

Figure 15:
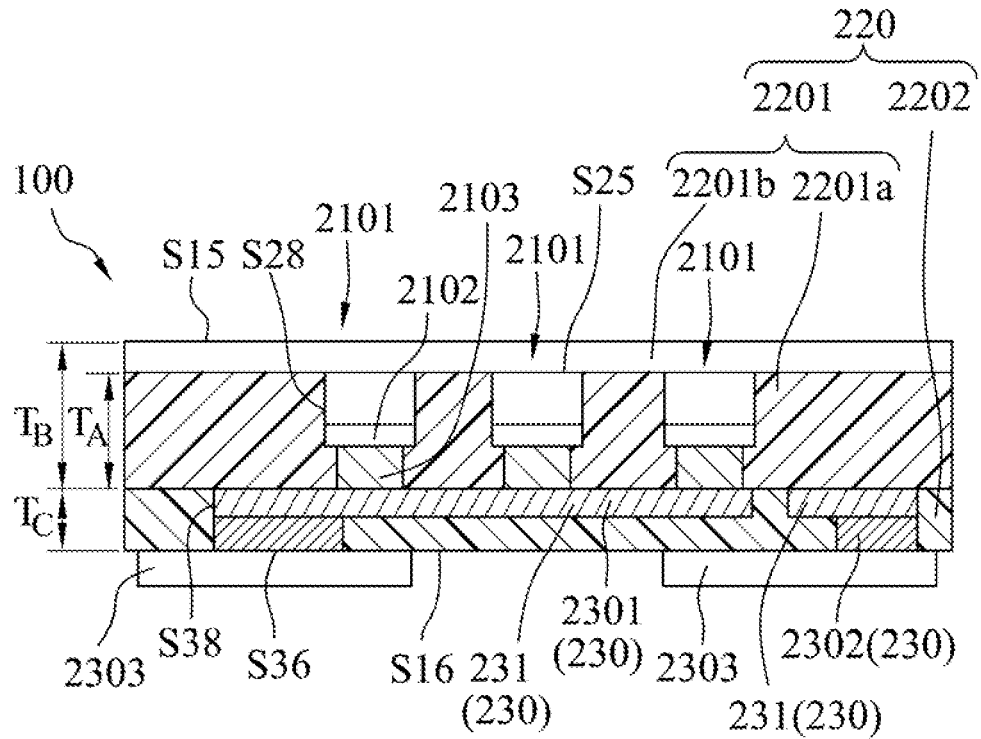
FIG. 15 is a cross-sectional view of a fourth embodiment of the LED packaging module according to the present disclosure.

Referring to FIG. 15, a fourth embodiment of the LED packaging module 100 according to the present disclosure is provided. FIG. 15 is a cross-sectional view of the fourth embodiment of the LED packaging module 100. The fourth embodiment of the LED packaging module 100 has a structure similar to that of the third embodiment as shown in FIG. 14, except that the first encapsulating layer 2201 in the fourth embodiment includes a lower encapsulating layer 2201a and an upper encapsulating layer 2201b. The lower encapsulating layer 2201a is formed to cover the chip side surfaces S28 of the LED chips 2101. The upper encapsulating layer 2201b covers the LED chips 2101 and overlies the lower encapsulating layer 2201a opposite to the second encapsulating layer 2202, and can prevent LED chips 2101 from being exposed. In some embodiments, the upper encapsulating layer 2201b covers the chip first surfaces 525 of the LED chips 2101 and the lower encapsulating layer 2201a. The upper encapsulating layer 2201b may be a light-transmitting layer made of, for example, but not limited to, silica gel or resin, which can reduce specular reflection and increase diffuse reflection, and is thus beneficial for rectifying uneven color distribution of the LED packaging structure 100. The upper encapsulating layer 2201b may include a light-scattering material. The upper encapsulating layer 2201b may have a light transmittance and a thickness similar to those of the light-transmitting layer 401 of the first embodiment of the present disclosure. In this embodiment, the LED chips 2101 have a thickness $T_A$, the first encapsulating layer 2201 (including the lower encapsulating layer 2201a and the upper encapsulating layer 2201b) has a thickness $T_B$, and the wiring layer 230 has a thickness $T_C$, and $T_A$ and $T_B$ satisfy a relationship: $T_B/T_A \geq 1$. To be noted is that, the thicknesses $T_A$ of the LED chips 2101 may be different from one another, and the thickness difference(s) is not depicted in FIG. 15 for the sake of simplicity. In certain embodiments, the LED chips 2101 are micro LED chips. In such case, each of the thicknesses $T_A$ of the LED chips 2101 ranges between about 3 μm and about 15 μm (in some embodiments, the thickness $T_A$ of the LED chips 2101 ranges between about 5 μm and about 15 μm), the thickness $T_B$ of the first encapsulating layer 2201 ranges between about 80 μm and about 100 μm, and the thickness $T_C$ of the wiring layer 230 ranges between about 20 μm and about 200 μm. In certain embodiments, the thickness $T_C$ of the wiring layer 230 ranges between about 40 μm and about 180 μm. $T_A$, $T_B$, and $T_C$ satisfy the relationship: $10 \leq (T_B + T_C)/T_A \leq 60$. In this embodiment, the thickness $T_C$ of the wiring layer 230 is designed to be not too large so that the strain and thermal resistance of the LED packaging module 100 may be decreased. The LED packaging module 100 of the present disclosure exhibits desired structural strength and reduced thickness.

Figure 16:
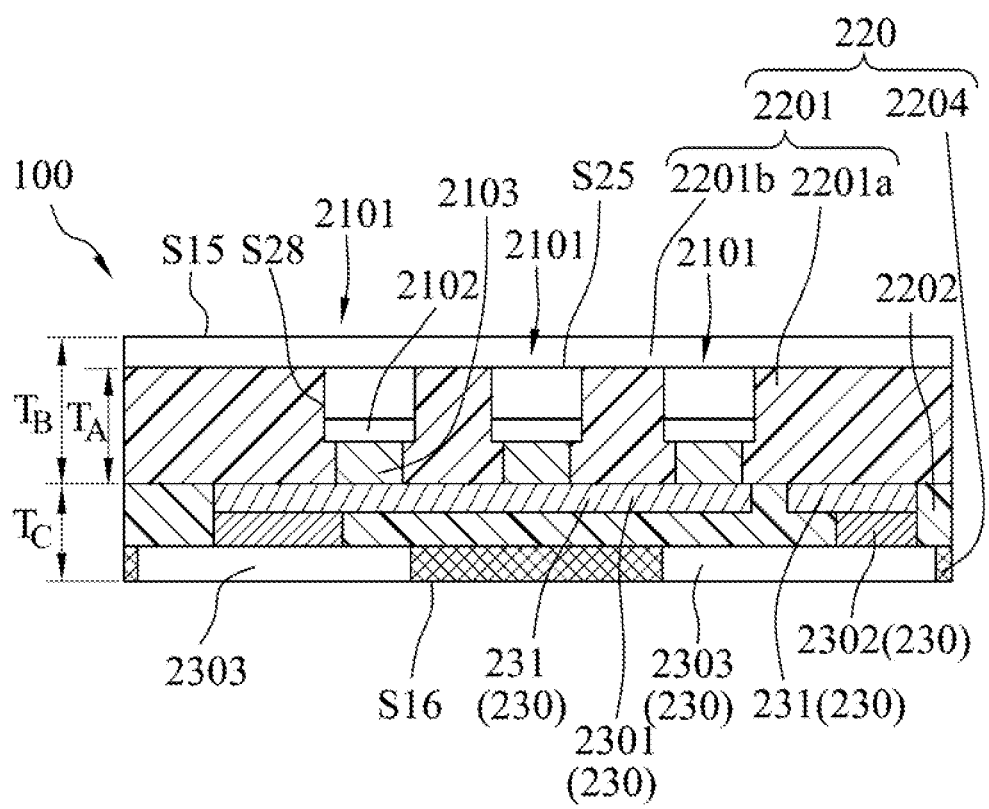
FIG. 16 is a cross-sectional view of a fifth embodiment of the LED packaging module according to the present disclosure.

Referring to FIG. 16, a fifth embodiment of the LED packaging module 100 according to the present disclosure is provided. FIG. 16 is a cross-sectional view of the fifth embodiment of the LED packaging module 100. The fifth embodiment of the LED packaging module 100 has a structure similar to that of the fourth embodiment (as shown in FIG. 15), except that the encapsulating component 220 in the fifth embodiment further includes a third encapsulating layer 2204 which overlies the second encapsulating layer 2202 opposite to the first encapsulating layer 2201, and which is formed to fill gaps among the welding pads 2303. To be noted is that, the thicknesses $T_A$ of the LED chips 2101 may be different from one another, and the thickness difference(s) is not depicted in FIG. 16 for the sake of simplicity. The third encapsulating layer 2204 may be an insulating layer made from, for example, but not limited to, epoxy resin, solder mask ink, or any combination thereof. In some embodiments, the third encapsulating layer 2204 includes black particles that has a size greater than black particles dispersed in the first encapsulating layer 2201 so as to ensure a hardness of the third encapsulating layer 2204. The first encapsulating layer 2201 implements the black particles with smaller size so that the first encapsulating layer 2201 can be densely filled with the small-sized black particles to ensure opaqueness of the first encapsulating layer 2201. It should be noted that when the third encapsulating layer 2204 fills the gaps among the welding pads 2303, the welding pads 2303 can be regarded as a part of the wiring layer 230, that is, the thickness $T_C$ includes a thickness of the first sub-wiring layer 2301, a thickness the second sub-wiring layer 2302, and a thickness of the welding pads 2303.

The embodiments of the present disclosure have the following advantages. The LED packaging module of the present disclosure is free of a substrate for supporting the LED, and the LED chips of the LED packaging module do not need solder paste, thereby avoiding problems due to poor chip soldering and problems occurred during reflow soldering. As such, the LED packaging module of the present disclosure can have a smaller size and achieve a higher degree of integration. In addition, the light-exiting surfaces of the LED chips having different wavelengths in the LED packaging module are set to have different surface heights. Moreover, the thin light-transmitting layer is provided to absorb a part of light emitted from the LED chips, and in combination with the different surface heights of the LED chips, brightness of the LED packaging module can be fine-tuned to achieve desired LED light output ratio requirements for different wavelengths, thereby ensuring color consistency of RGB display devices including the LED packaging module of the present disclosure. Moreover, by controlling the surface height differences among the chip first surfaces of the LED chips to be not greater than 15 μm, and using the encapsulant component having the light-absorbing material, optical crosstalk among the chip side surfaces of the LED chips can be effectively reduced.

Some embodiments of the LED packaging module of the present disclosure are highly suitable for application in display panels due to the reduced size of the LED packaging module, which is vital for improving the resolution of the display panel. Moreover, due to the chip side surfaces of the LED chips being covered by the encapsulant component so that light exits mainly from the chip first surfaces, the LED packaging module has a greatly reduced proportion of light-emitting areas with respect to a total surface area of the LED packaging module, which is extremely conducive to improving the contrast of the display panel. The proportion of light-emitting areas of the LED packaging module may be less than 30%, or even less than 5%, for example, 8.5%, 2.8%, 1.125%, or even less.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode (LED) packaging module, comprising:
   a plurality of LED chips that are spaced apart from one another, each of said LED chips including:
     a chip first surface as a light-exiting surface,
     a chip second surface opposite to said chip first surface,
     a chip side surface that connects said chip first surface and said chip second surface, and
     an electrode unit formed on said chip second surface;
   a wiring layer that is disposed on said chip second surfaces of said LED chips, and that has a first wiring layer surface adjacent to said LED chips, a second wiring layer surface opposite to said first wiring layer surface, and a side wiring layer surface that is connected between said first wiring layer surface and said second wiring layer surface, said wiring layer being divided into a plurality of wiring parts that are spaced apart from each other, said first wiring layer surface contacting and being electrically connected to said electrode units of said LED chips; and
   an encapsulant component including a first encapsulating layer that covers said chip side surface of each of said LED chips, and a second encapsulating layer that covers said side wiring layer surface of said wiring layer and that fills gaps among said wiring parts,
   wherein
   each of said LED chips has a thickness $T_A$, said first encapsulating layer has a thickness $T_B$, and $T_A$ and $T_B$ satisfy a relationship: $T_B/T_A \geq 1$.

2. The LED packaging module as claimed in claim 1, wherein
   said thickness $T_A$ of each of said LED chips ranges from 5 μm to 15 μm;
   said thickness $T_B$ of said first encapsulating layer ranges from 80 μm to 100 μm; and
   said wiring layer has a thickness $T_C$ that ranges from 20 μm to 200 μm.

3. The LED packaging module as claimed in claim 2, wherein $(T_B+T_C)/T_A \geq 10$ and $(T_B+T_C)/T_A \leq 60$.

4. The LED packaging module as claimed in claim 1, wherein said first encapsulating layer includes a lower encapsulating layer and an upper encapsulating layer overlying said lower encapsulating layer opposite to said second encapsulating layer.

5. The LED packaging module as claimed in claim 1, wherein each of said LED chips is a micro LED chip.

6. The LED packaging module as claimed in claim 1, wherein at least two of said LED chips have different wavelengths.

7. The LED packaging module as claimed in claim 1, wherein said electrode unit includes two electrodes disposed on said chip second surface.

8. The LED packaging module as claimed in claim 1, wherein:
   said encapsulant component further has a first encapsulating surface and a second encapsulating surface opposite to said first encapsulating surface, said first encapsulating surface facing in a same direction as said chip first surfaces of said LED chips;
   at least two of said LED chips have different wavelengths;
   wherein said chip first surfaces of at least two of said LED chips have a height difference that is greater than 0 μm and less than 5 μm.

9. The LED packaging module as claimed in claim 1, wherein:
   said first encapsulating layer includes a lower encapsulating layer and an upper encapsulating layer overlying said lower encapsulating layer opposite to said second encapsulating layer; and
   said said first encapsulating layer includes a light-absorbing material.

10. The LED packaging module as claimed in claim 9, wherein said upper encapsulating layer has a thickness that ranges from 5 μm to 20 μm.

11. The LED packaging module as claimed in claim 9, wherein said first encapsulating layer has a light transmittance that is not greater than that of said second encapsulating layer.

12. The LED packaging module as claimed in claim 1, wherein:
   said second encapsulating surface of said encapsulant component and said second wiring layer surface are situated at a same side of said encapsulant component; and
   said chip first surface of said blue LED chip has a surface height that is measured from said second encapsulating surface of said encapsulant component and that is smaller than those of said green LED chip and said red LED chip.

13. The LED packaging module as claimed in claim 1, wherein:
   said second encapsulating surface of said encapsulant component and said second wiring layer surface are situated at a same side of said encapsulant component; and
   said chip first surface of said red LED chip has a surface height that is measured from said second encapsulating surface of said encapsulant component and that is smaller than those of each of said green LED chip and said blue LED chip.

14. The LED packaging module as claimed in claim 1, wherein said LED packaging module has a thickness that ranges from 100 μm to 500 μm.

15. The LED packaging module as claimed in claim 1, further comprising at least two welding pads disposed on said second encapsulating layer and electrically connected to said second wiring layer surface of said wiring layer.

16. The LED packaging module as claimed in claim 15, wherein said encapsulant component further includes a third encapsulating layer overlying said second encapsulating layer opposite to said first encapsulating layer and situated at the side surface of the two welding pads.

17. The LED packaging module as claimed in claim 16, wherein said third encapsulating layer includes black particles that has a size greater than black particles dispersed in said first encapsulating layer.

18. A light-emitting diode (LED) packaging module, comprising:
- a plurality of LED chips that are spaced apart from each other, each of said LED chips including
  - a chip first surface as a light-exiting surface,
  - a chip second surface opposite to said chip first surface,
  - at least two electrodes disposed on said chip second surface, and
  - a chip side surface connected to said chip first surface and said chip second surface;
- a wiring layer that is disposed on said chip second surfaces of said LED chips, and that has
  - a first wiring layer surface,
  - a second wiring layer surface opposite to said first wiring layer surface, and
  - a side wiring layer surface connected between said first wiring layer surface and said second wiring layer surface, said wiring layer being divided into a plurality of wiring parts that are spaced apart from each other, said first wiring layer surface contacting and being electrically connected to said electrodes of said LED chips;
- an encapsulant component that covers said LED chips and said wiring layer, and fills gaps among said LED chips and gaps among said wiring parts, said encapsulant component including a first encapsulating surface, and a second encapsulating surface opposite to said first encapsulating surface; and
- a light-transmitting layer that covers said chip first surfaces of said LED chips, wherein
- said first encapsulating surface of said encapsulant component faces in a same direction as said chip first surfaces of said LED chips,
- said second encapsulating surface of said encapsulant component faces in a same direction as said second wiring layer surface of said wiring layer,
- said chip first surfaces of at least two of said LED chips have a height difference that is greater than 0 μm and not greater than 15 μm, and
- said at least two of said LED chips have different wavelengths.

19. The LED packaging module as claimed in claim 18, wherein said encapsulant component has at least two layers, and one of said layers of said encapsulant component that fills gaps among said LED chips includes a light-absorbing material.

20. The LED packaging module as claimed in claim 18, wherein said encapsulant component has a plurality of layers, one of said layers covering said wiring layer has a light transmittance greater than that of another one of said layers which covers said LED chips.

* * * * *